(12) United States Patent
Lin et al.

(10) Patent No.: US 7,196,374 B1
(45) Date of Patent: Mar. 27, 2007

(54) DOPED STRUCTURE FOR FINFET DEVICES

(75) Inventors: Ming-Ren Lin, Cupertino, CA (US);
Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 99 days.

(21) Appl. No.: 10/653,274

(22) Filed: Sep. 3, 2003

(51) Int. Cl.
*H01L 29/76* (2006.01)

(52) U.S. Cl. .............. 257/327; 257/328; 257/329; 257/347; 257/348; 257/349; 257/350; 257/365; 257/366

(58) Field of Classification Search ........... 257/351, 257/364, 365, 369, 401, 40, 314, 315
See application file for complete search history.

(56) References Cited

U.S. PATENT DOCUMENTS

| | | | |
|---|---|---|---|
| 6,800,905 B2 * | 10/2004 | Fried et al. ............ | 257/351 |
| 2003/0042531 A1 * | 3/2003 | Lee et al. ............ | 257/315 |
| 2004/0075122 A1 * | 4/2004 | Lin et al. ............ | 257/288 |
| 2004/0145000 A1 * | 7/2004 | An et al. ............ | 257/270 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—Leonardo Andujar
*Assistant Examiner*—Tan Tran
(74) *Attorney, Agent, or Firm*—Harrity Snyder, LLP

(57) ABSTRACT

A semiconductor device includes a substrate and an insulating layer on the substrate. The semiconductor device also includes a fin structure formed on the insulating layer, where the fin structure includes first and second side surfaces, a dielectric layer formed on the first and second side surfaces of the fin structure, a first gate electrode formed adjacent the dielectric layer on the first side surface of the fin structure, a second gate electrode formed adjacent the dielectric layer on the second side surface of the fin structure, and a doped structure formed on an upper surface of the fin structure in the channel region of the semiconductor device.

13 Claims, 18 Drawing Sheets

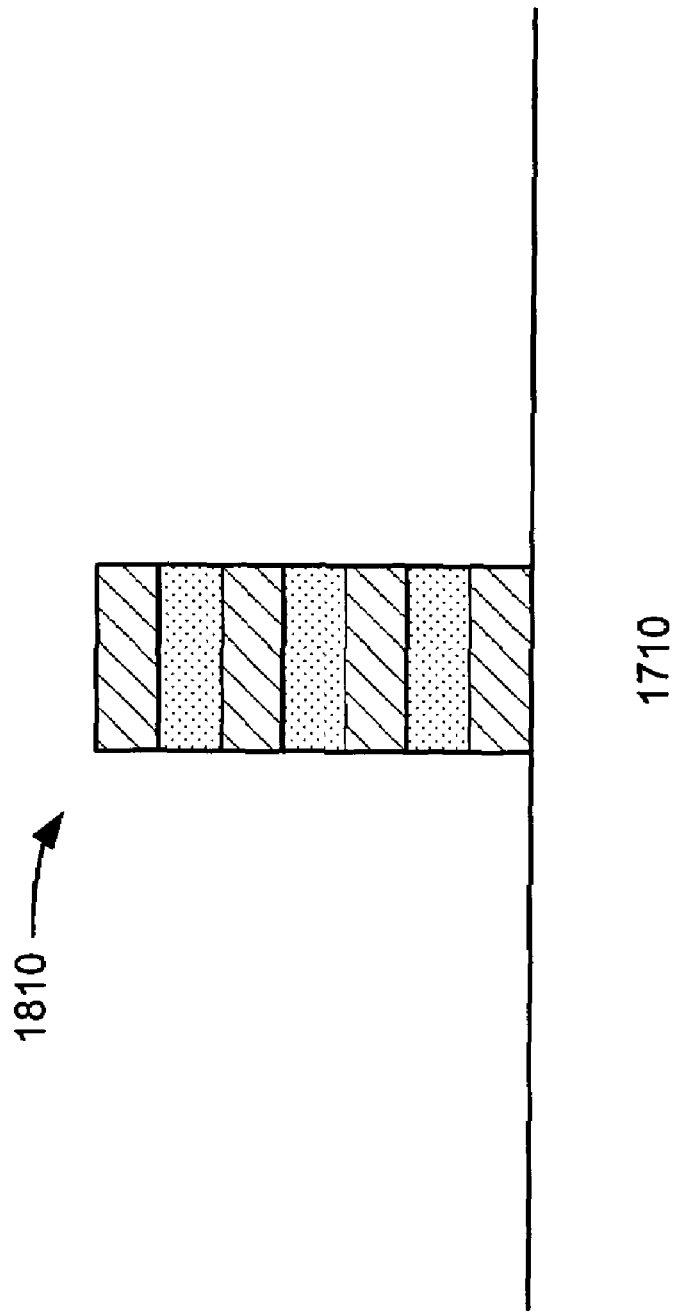

US 7,196,374 B1

DOPED STRUCTURE FOR FINFET DEVICES

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention provide FinFET devices with a selective epitaxial layer formed on the upper surface of the fin structure in the channel region of the semiconductor device. The selective epitaxial layer may be doped to provide low contact resistance with respect to the fin structure. The selective epitaxial layer also provides an optional biasing opportunity, thereby enhancing FinFET performance.

In accordance with the purpose of this invention as embodied and broadly described herein, a semiconductor device includes a fin structure, a source region formed at one end of the fin structure, a drain region formed at an opposite end of the fin structure, a first gate formed on a first side of the fin structure, a second gate formed on a second side of the fin structure, and a doped silicon structure formed on an upper surface of the fin structure.

In another implementation consistent with the present invention, a semiconductor device that includes a substrate and an insulating layer on the substrate is disclosed. The semiconductor device includes a fin structure formed on the insulating layer, where the fin structure includes first and second side surfaces; a dielectric layer formed on the first and second side surfaces of the fin structure; a first gate electrode formed adjacent the dielectric layer on the first side surface of the fin structure; a second gate electrode formed adjacent the dielectric layer on the second side surface of the fin structure; and a doped structure formed on an upper surface of the fin structure in the channel region of the semiconductor device.

In yet another implementation consistent with the principles of the invention, a method of manufacturing a semiconductor device is disclosed. The method includes forming a fin structure, where the fin structure includes first and second side surfaces; forming a dielectric layer on the first and second side surfaces of the fin structure; depositing a gate material layer over the fin structure; planarizing the gate material layer to expose an upper surface of the fin structure; etching the gate material layer to form a first gate electrode and a second gate electrode, where the second gate electrode is formed on an opposite side of the fin structure than the first gate electrode; etching the gate material layer to recess the first gate electrode and the second gate electrode from the fin structure; depositing a second dielectric layer over the fin structure and the first and second gate electrodes; etching the second dielectric layer to create an opening to expose at least a portion of the fin structure; and performing a selective epitaxial growth process to form a silicon layer to fill the opening.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 17 and 18 illustrate an exemplary process for forming a fin structure in a FinFET device in an alternate implementation consistent with the principles of the invention.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide FinFET devices with a selective epitaxially grown layer formed on the upper surface of the fin structure in the channel region of the FinFET device. The selective epitaxial layer may be doped to provide low contact resistance to the fin structure. The selective epitaxial layer provides an optional biasing opportunity.

Exemplary Processing

Figure 1:
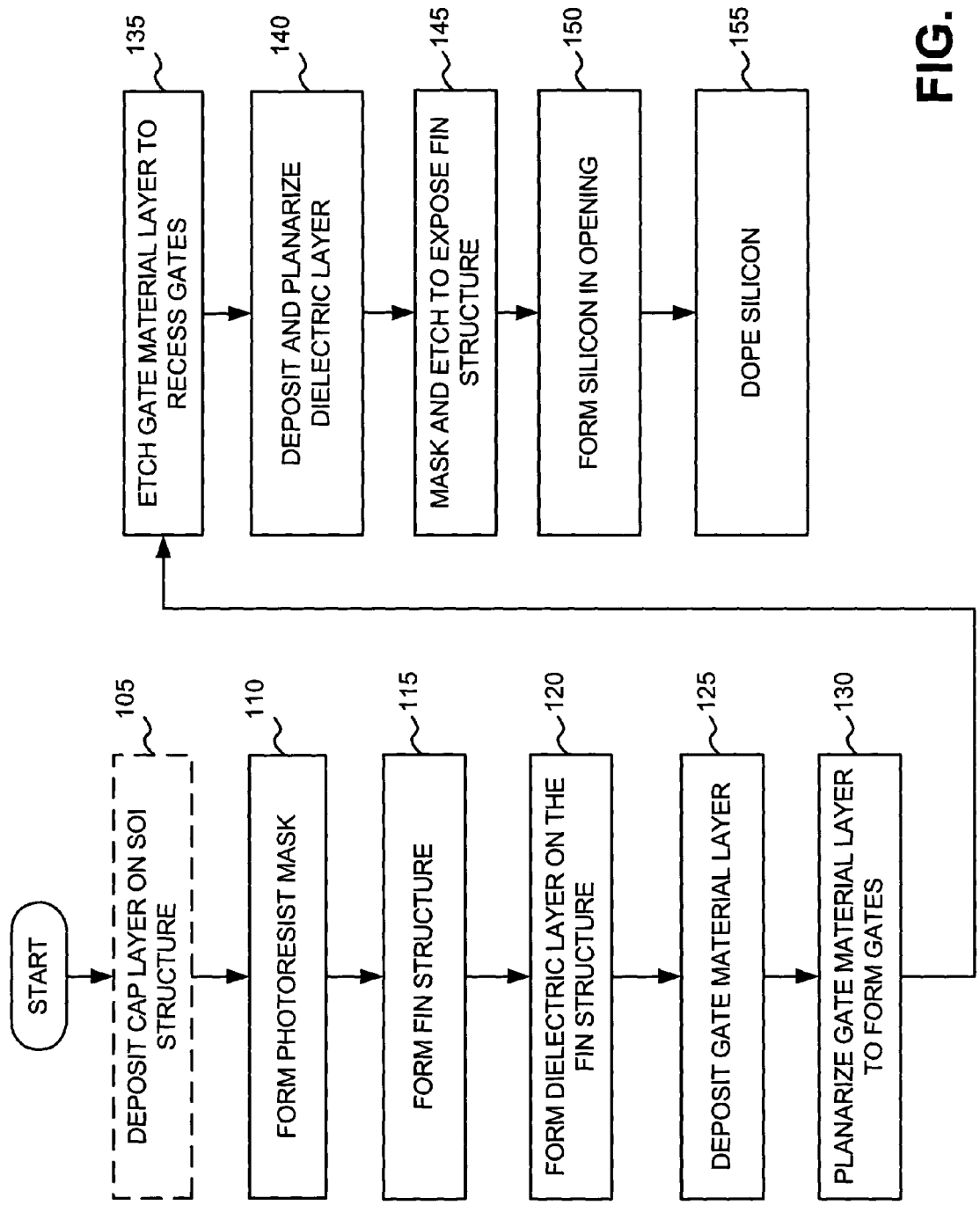
FIG. 1 illustrates an exemplary process for forming a FinFET device in an implementation consistent with the principles of the invention.

FIG. 1 illustrates an exemplary process for forming a FinFET device in an implementation consistent with the principles of the invention. FIGS. 2–12 illustrate exemplary views of a FinFET device fabricated according to the processing described in FIG. 1. The fabrication of one FinFET device will be described hereinafter. It will be appreciated, however, that the techniques described herein are equally applicable to forming more than one FinFET device.

Figure 2:
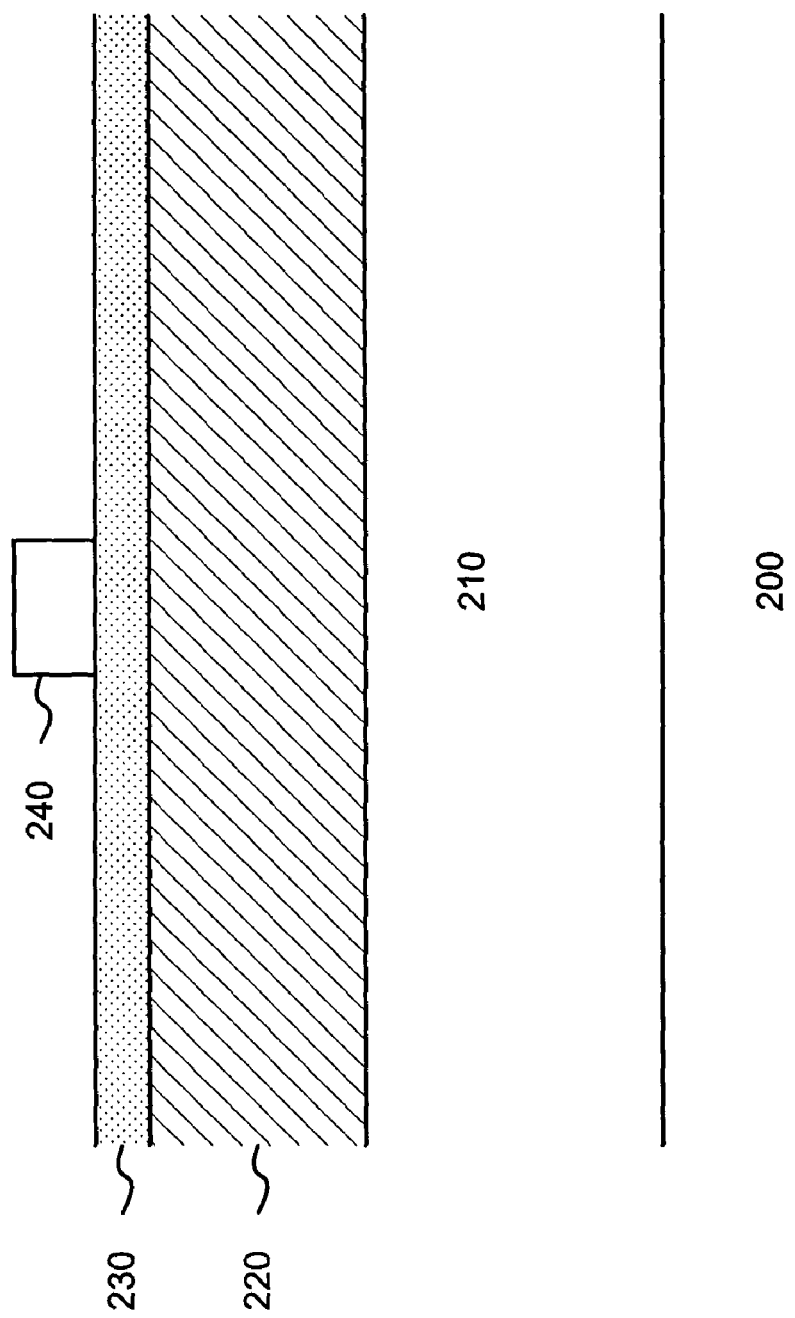
FIGS. 2–12 illustrate exemplary views of a FinFET device fabricated according to the processing described in FIG. 1.

With reference to FIGS. 1 and 2, processing may begin with a semiconductor device that includes a silicon on insulator (SOI) structure. The SOI structure may include a silicon substrate 200, a buried oxide layer 210, and a silicon layer 220 on buried oxide layer 210. Buried oxide layer 210 and silicon layer 220 may be formed on substrate 200 in a conventional manner.

In an exemplary implementation, buried oxide layer 210 may include a silicon oxide and may have a thickness ranging from about 500 Å to about 3000 Å. Silicon layer 220 may include monocrystalline silicon having a thickness ranging from about 200 Å to about 1000 Å. Silicon layer 220 is used to form a fin for a FinFET device, as described in more detail below.

In alternative implementations consistent with the present invention, substrate 200 and layer 220 may comprise other semiconducting materials, such as germanium, or combinations of semiconducting materials, such as silicon-germanium. Buried oxide layer 210 may also include other dielectric materials.

A protective cap layer 230, such as a silicon oxide layer (e.g., $SiO_2$), may optionally be deposited on silicon layer 220 (act 105). Protective cap layer 230 may protect the subsequently formed fin during various etching processes. In one implementation, protective cap layer 230 may be deposited to a thickness ranging from about 50 Å to about 500 Å.

Next, a photoresist material may be deposited and patterned to form a photoresist mask 240 for subsequent processing (act 110). The photoresist may be deposited and patterned in any conventional manner. In an exemplary implementation, photoresist mask 240 may be trimmed to a width ranging from about 50 Å to about 500 Å.

Source and drain regions may also be formed in silicon layer 220. For example, silicon layer 220 may be patterned and etched in a conventional manner to form source and drain regions on buried oxide layer 210 adjacent the area in which the fin will be formed. Alternatively, the source/drain regions may be formed by depositing and patterning a layer of silicon, germanium, or a combination of silicon and germanium after the fin structure is formed.

Figure 3:
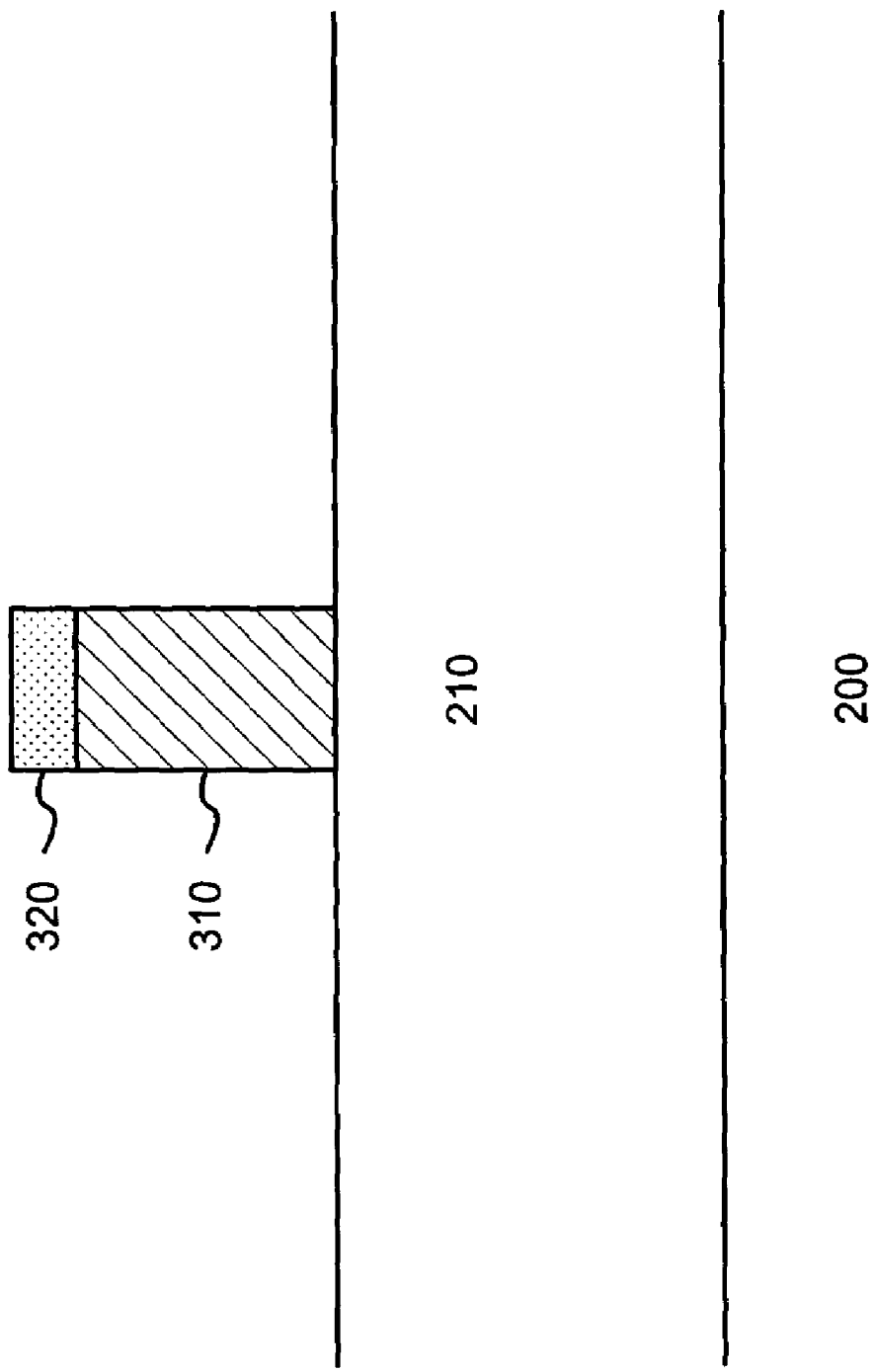

The semiconductor device may then be etched to form the fin structure (act 115). In an exemplary implementation, the portion of protective cap layer 230 and silicon layer 220 not located below photoresist mask 240 may be etched in a conventional manner with the etching terminating on buried oxide layer 210, thereby forming fin 310 having a protective cap 320, as illustrated in FIG. 3. Fin 310 comprises silicon and may be formed to approximately the same width as photoresist mask 240 (e.g., a width of about 50 Å to about 500 Å). As illustrated in FIG. 3, photoresist mask 240 may be removed after forming fin 310.

Figure 4:
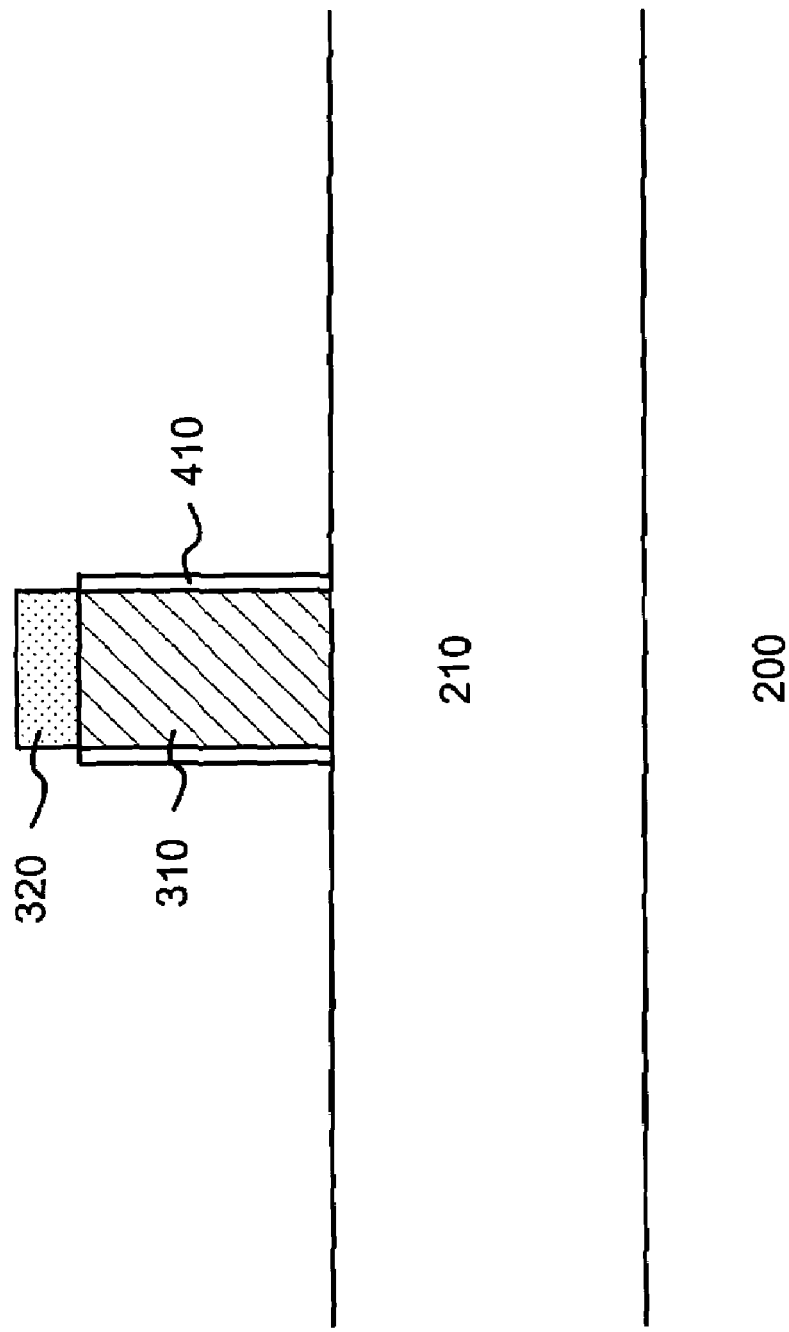

A dielectric layer may then be formed on fin 310 (act 120). For example, a thin oxide film 410 may be thermally grown on fin 310, as illustrated in FIG. 4. In an exemplary implementation, oxide layer 410 may be grown to a thickness of about 8 Å to about 50 Å and may be formed on the exposed silicon side surfaces of fin 310 to act as a gate dielectric layer.

Figure 5:
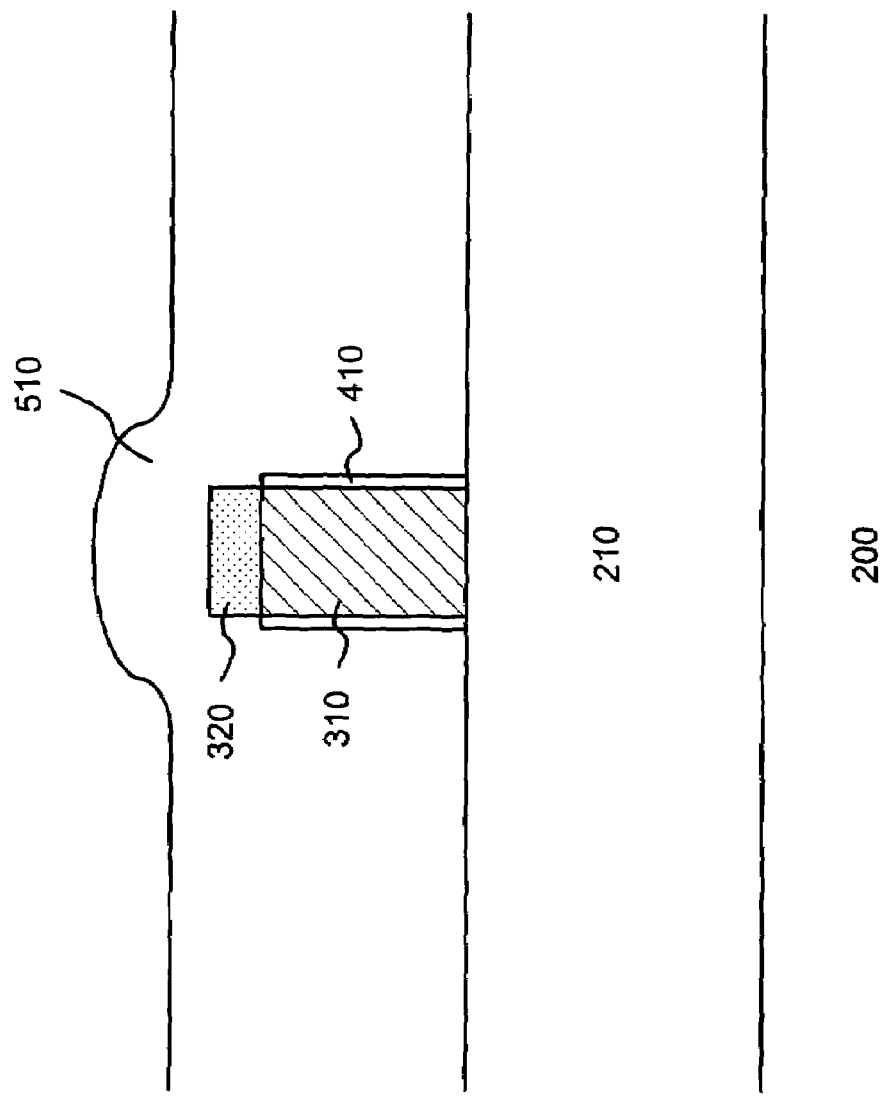

A gate material layer 510 may then be deposited over the semiconductor device, as illustrated in FIG. 5 (act 125). Gate material layer 510 may comprise the gate material for the subsequently formed gate electrodes. In an exemplary implementation, gate material layer 510 may include polysilicon deposited using conventional chemical vapor deposition (CVD) to a thickness ranging from about 200 Å to about 2000 Å. Alternatively, other semiconducting materials, such as germanium or combinations of silicon and germanium, or various metals may be used as the gate material.

Figure 6:
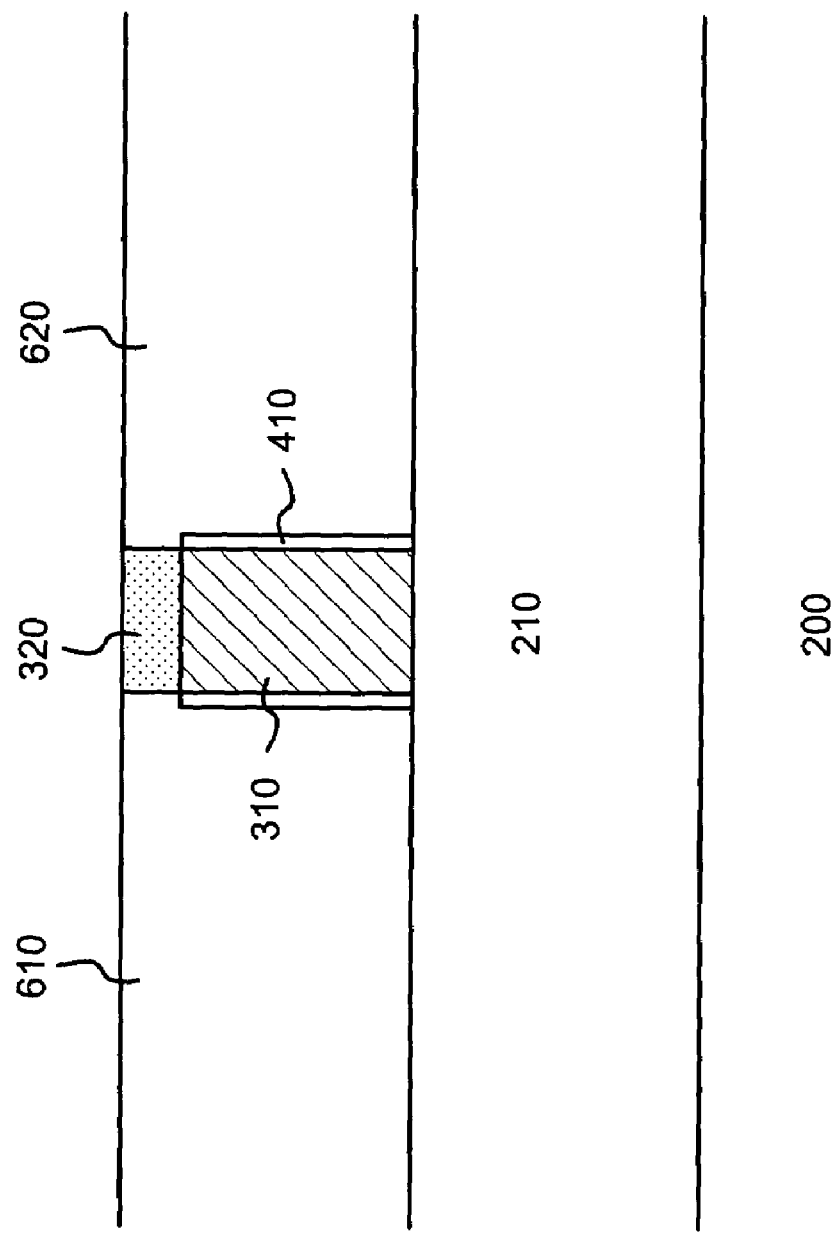

The semiconductor device may be planarized (act 130). For example, a chemical-mechanical polishing (CMP) may be performed to planarize the gate material so that the upper surface of gate material layer 510 is planar with the upper surface of protective cap 320, as illustrated in FIG. 6. Gate material layer 510 may then be patterned and etched to form gate electrodes 610 and 620. As illustrated, gate electrodes 610 and 620 may be formed on opposite sides of fin structure 310 and may be electrically separated by fin structure 310. Gate electrodes 610 and 620 may also be separately biased during operation of the semiconductor device.

Figure 7:
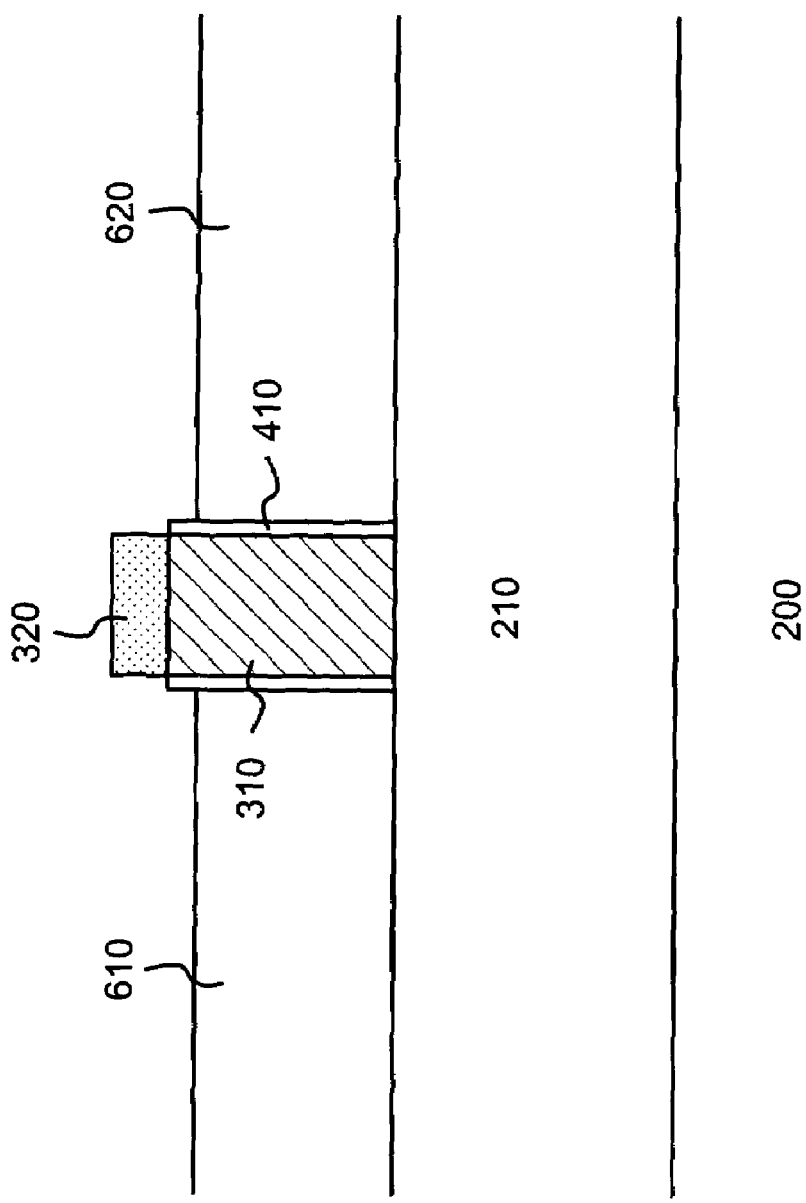
Figure 8:
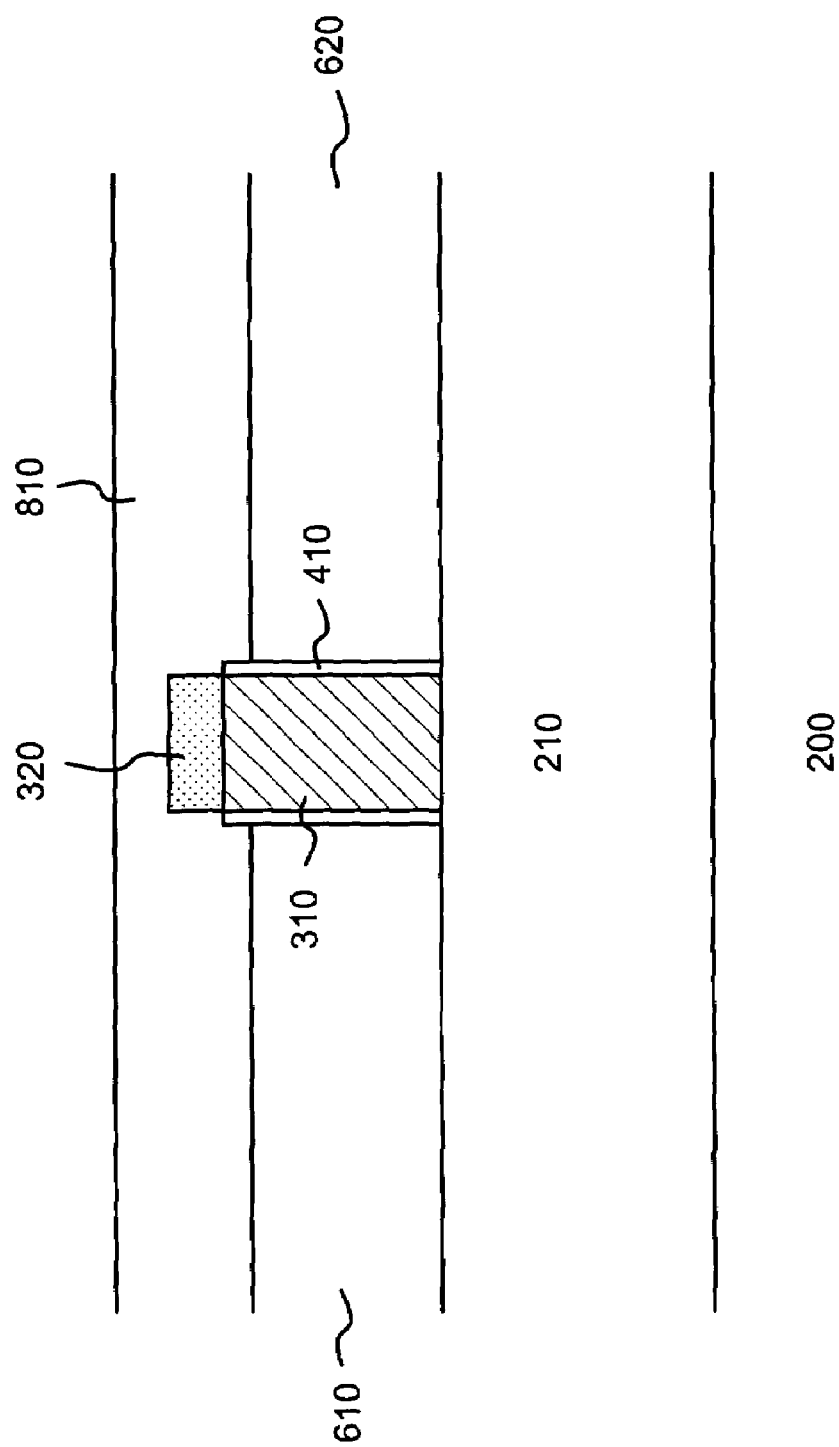

Gate electrodes 610 and 620 may be etched to recess gates 610 and 620, as illustrated in FIG. 7 (act 135). In one implementation, gate electrodes 610 and 620 may be etched to remove about 50 Å to 1000 Å of the upper portion of the gate material. The resulting thickness of gate electrodes 610 and 620 may range from about 200 Å to 1500 Å. A dielectric layer 810 may then be deposited on the semiconductor device and subsequently planarized, as illustrated in FIG. 8 (act 140). In one implementation, dielectric layer 810 may comprise an oxide, such as silicon dioxide, and may be deposited and planarized to a thickness ranging from about 50 Å to 5000 Å. Alternatively, dielectric layer 810 may comprise other dielectric materials.

Figure 9:
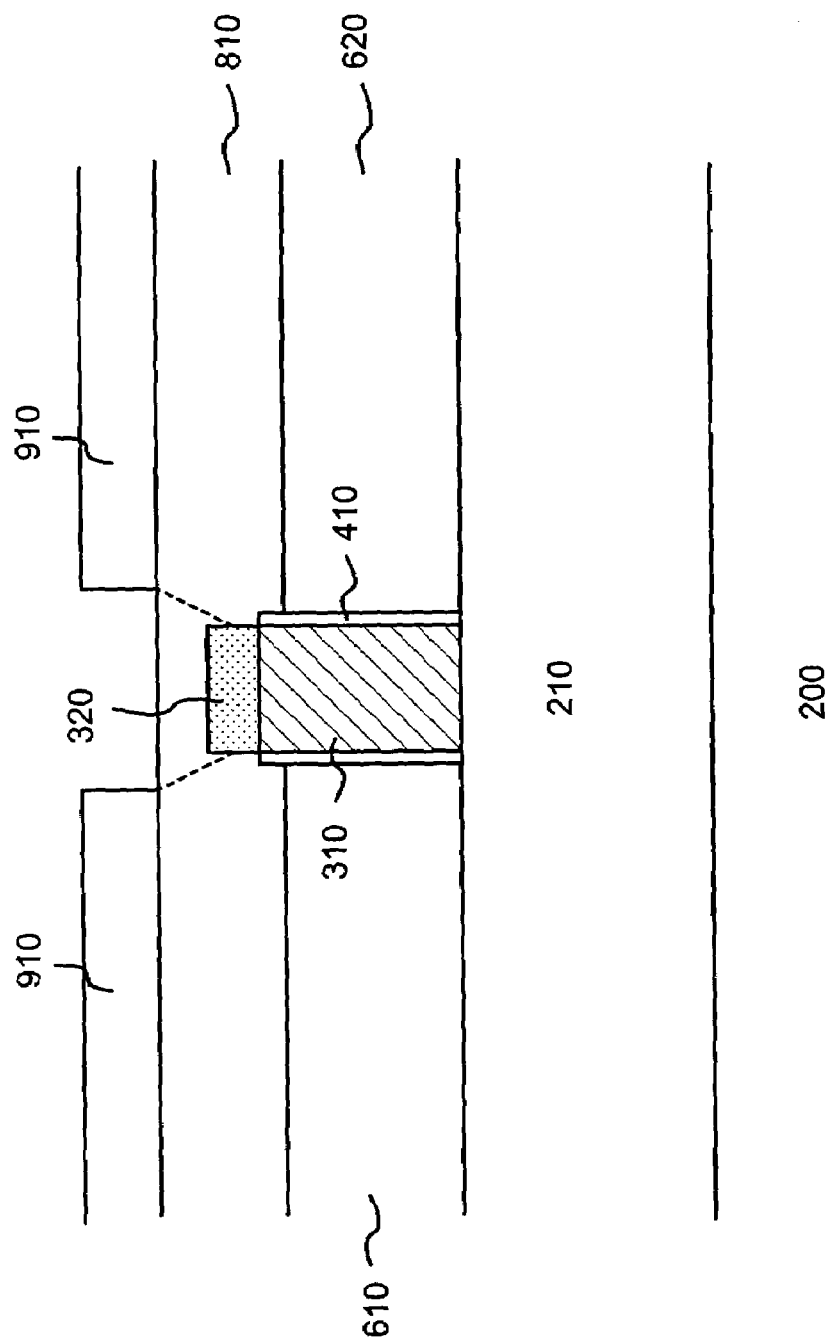
Figure 10:
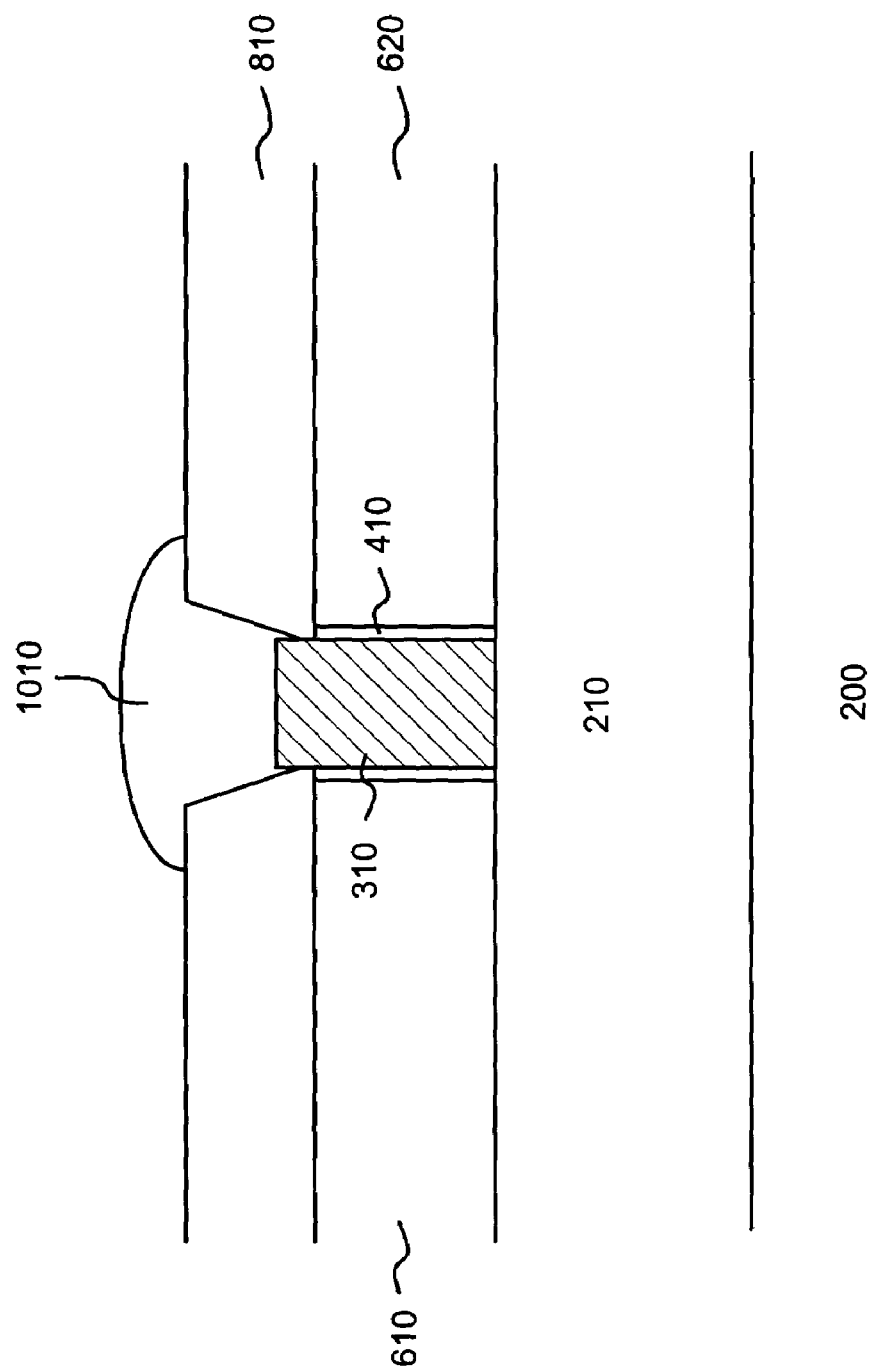

Photoresist masks 910 may then be formed on dielectric layer 810 to create a window for exposing fin structure 310, as illustrated in FIG. 9 (act 145). That portion of dielectric layer 810 not covered by photoresist masks 910 and dielectric cap 320 may be etched in a well-known manner to expose fin structure 310, as illustrated in FIG. 10 (act 145). Silicon 1010 may then be formed in the opening created by the etching described above (act 150). In one implementation, the silicon in fin structure 310 may be used as a seed layer for a selective epitaxial growth (SEG) process to grow silicon 1010 in the opening to a thickness ranging from about 500 Å to about 5000 Å and a width ranging from about 50 Å to about 5000 Å. The selective epitaxial layer 1010 provides low resistance with respect to the body of fin structure 310.

Figure 11:
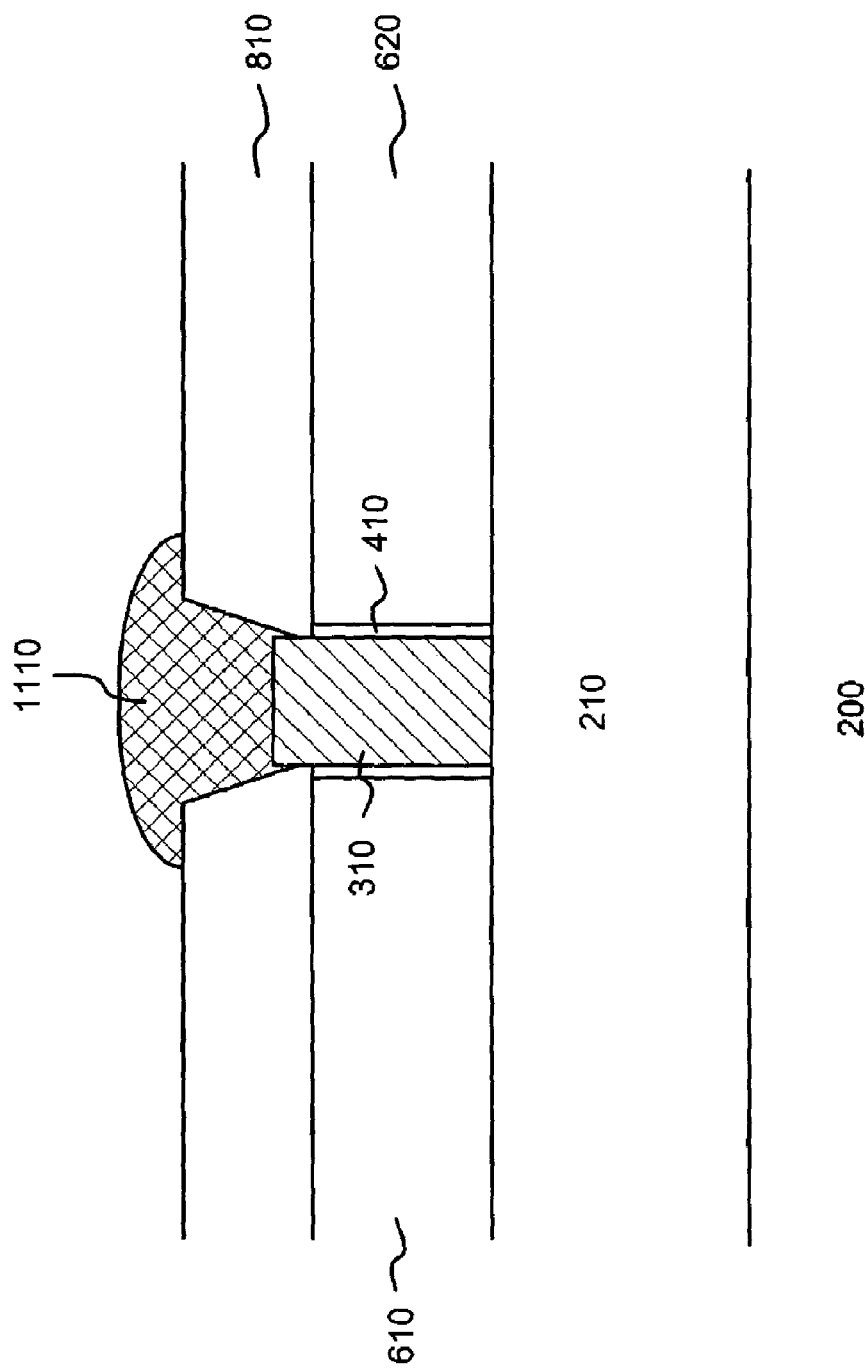

Silicon 1010 may then be doped to form a doped contact 1110, as illustrated in FIG. 11 (act 155). Doping silicon 1010 to form doped contact 1110 may further reduce the resistance of contact 1110 with respect to fin structure 310. For example, n-type or p-type impurities may be implanted in silicon 1010. The particular implantation dosages and energies may be selected based on the particular end device requirements. One of ordinary skill in this art would be able to optimize the implantation process based on the circuit requirements and such steps are not disclosed herein in order not to unduly obscure the thrust of the present invention.

Figure 12:
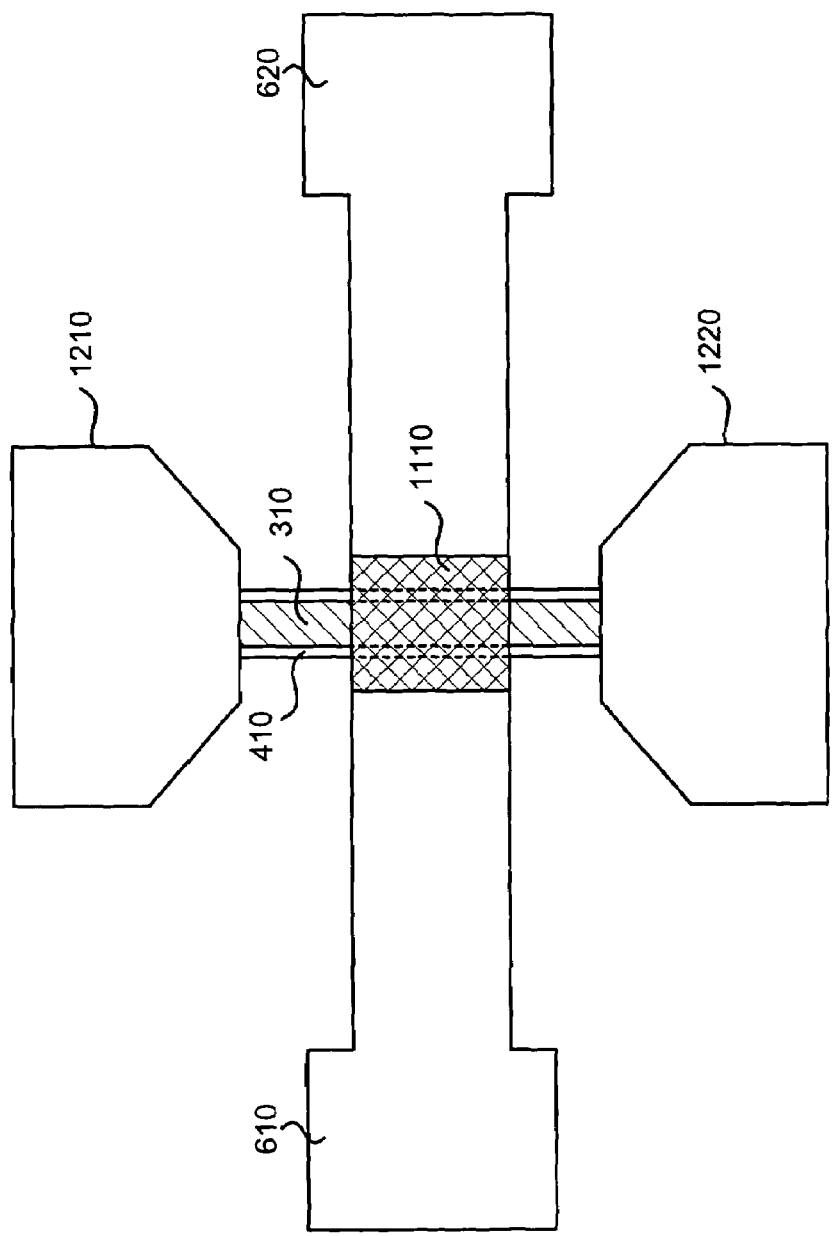

FIG. 12 illustrates an exemplary top view of the semiconductor device. As illustrated, the semiconductor device includes a double-gate structure with fin 310, source and drain regions 1210 and 1220, gate electrodes 610 and 620, and doped silicon contact 1110 that is formed on an upper surface of fin 310 in the channel region of the semiconductor device. This doped contact 1110 may act as a third gate electrode and may be separately biased during operation of the semiconductor device. Dielectric layer 810 is not shown in FIG. 12 for simplicity.

Thus, in accordance with the principles of the invention, a selective epitaxially grown layer is formed on the upper surface of the fin structure in the channel region of the semiconductor device. The epitaxial layer may be doped to provide a contact/gate electrode having low resistance with respect to the fin structure. The epitaxial layer also provides an optional biasing opportunity, thereby enhancing FinFET performance.

Other Implementations

Figure 13:
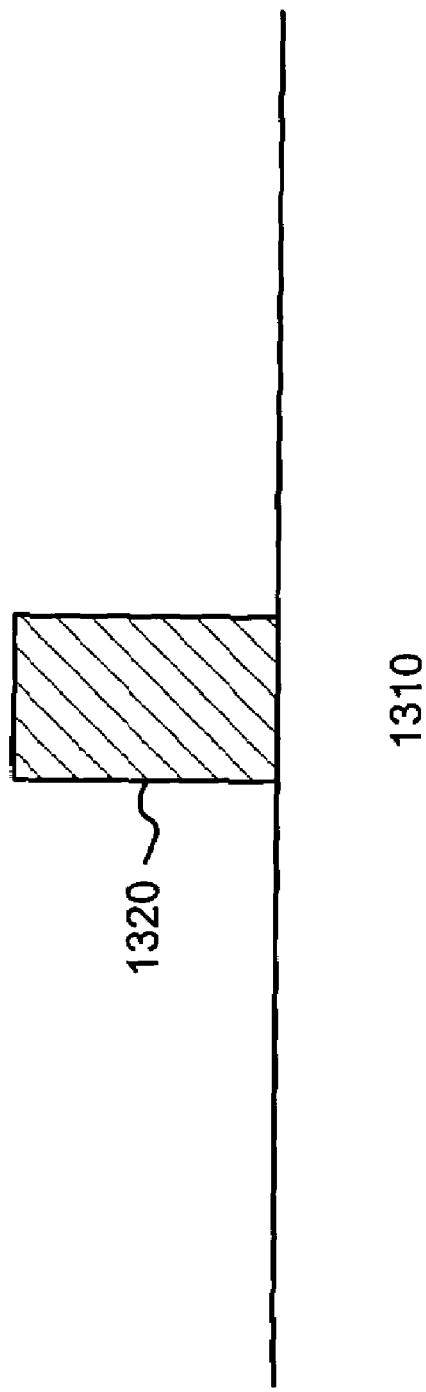
FIGS. 13–16 illustrate an exemplary process for planarizing a gate material layer in an alternative implementation consistent with the principles of the invention.

FIGS. 13–16 illustrate an exemplary process for planarizing a gate material layer in an alternative implementation consistent with the principles of the invention. With reference to FIG. 13, processing may begin with a semiconductor device that includes an oxide layer 1310 formed on a substrate (not shown). A fin structure 1320 may be formed on oxide layer 1310 in a conventional manner. Fin structure 1320 may comprise silicon or other semiconducting materials, such as germanium, or combinations of semiconducting materials, such as silicon-germanium.

Figure 14:
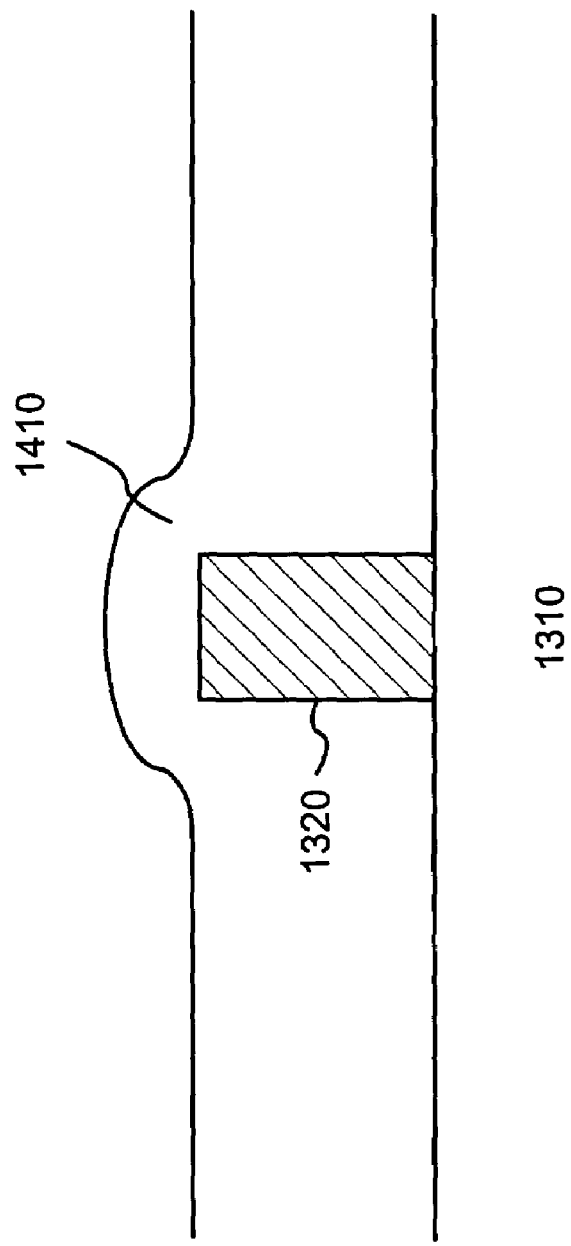

A gate material layer 1410 may then be deposited over the semiconductor device, as illustrated in FIG. 14. In an exemplary implementation, gate material layer 1410 may include polysilicon deposited using conventional chemical vapor deposition (CVD) to a thickness ranging from about 200 Å to about 2000 Å. Alternatively, other semiconducting materials, such as germanium or combinations of silicon and germanium, or various metals may be used as the gate material.

Figure 15:
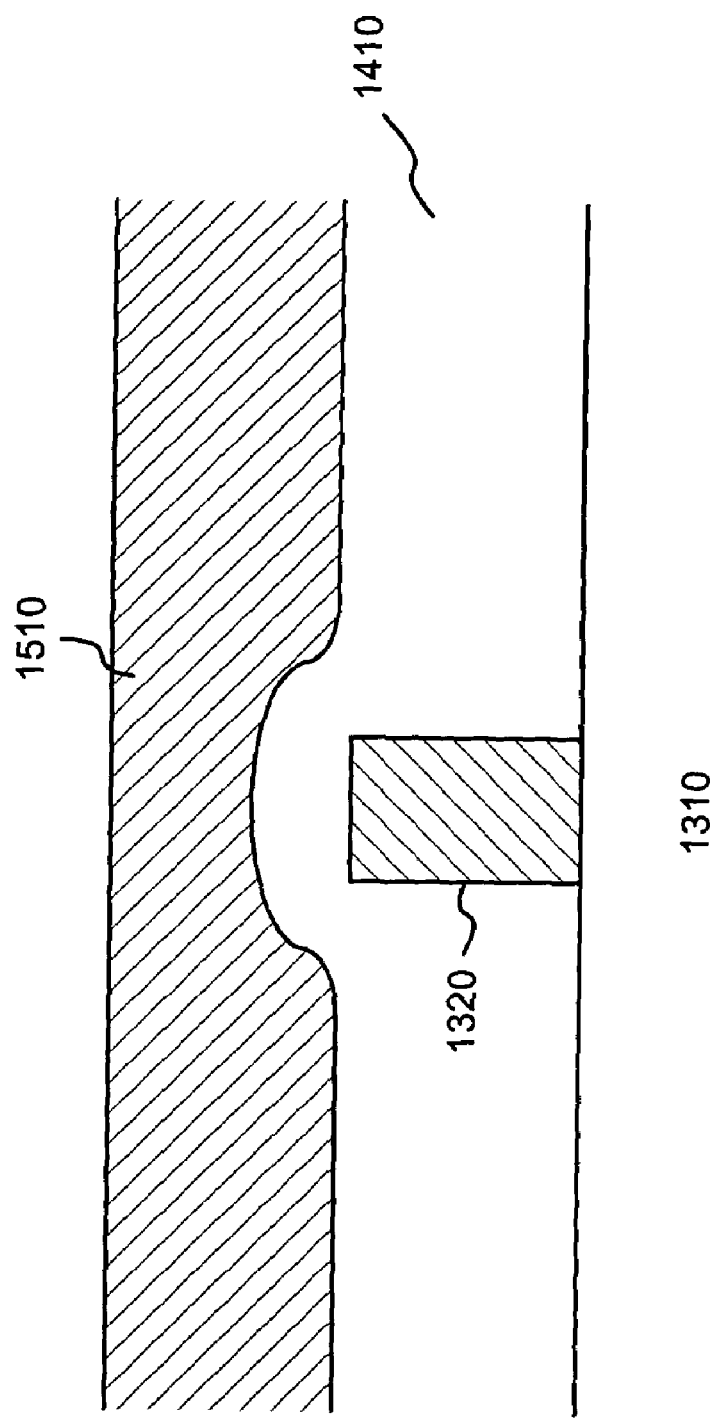

A photoresist 1510 may be deposited over gate material layer 1410, as illustrated in FIG. 15. In one implementation, photoresist 1510 may be deposited using, for example, a spin-on process. A photoresist-etch back operation may be performed to planarize the semiconductor device. In an exemplary implementation, a HBr/$O_2$ or $O_2$ etch chemistry may be used to etch the photoresist 1510. The particular flow rates, power ranges, bias voltages, etch duration and other parameters associated with etching photoresist 1510 may be optimized based on the thickness of photoresist 1510. This etch back operation acts to diminish the dishing effect that is common in conventional FinFET fabrication processing.

Figure 16:
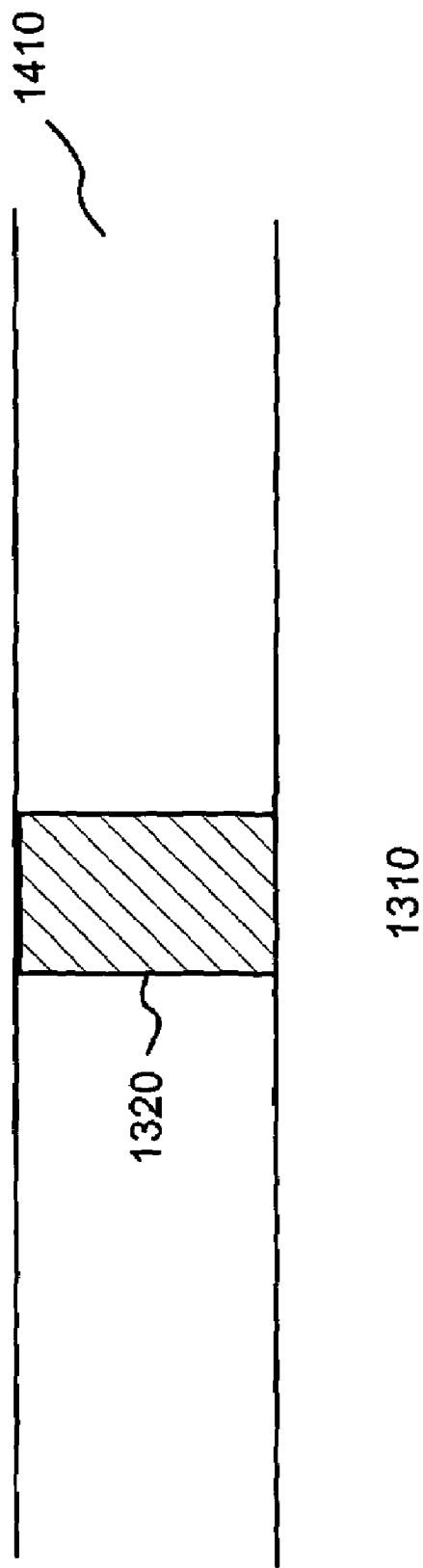

Following the etch back operation, a surface of the semiconductor may be substantially planarized, as illustrated in FIG. 16. An additional CMP may be performed if needed to further planarize gate material layer 1410.

Figure 17:
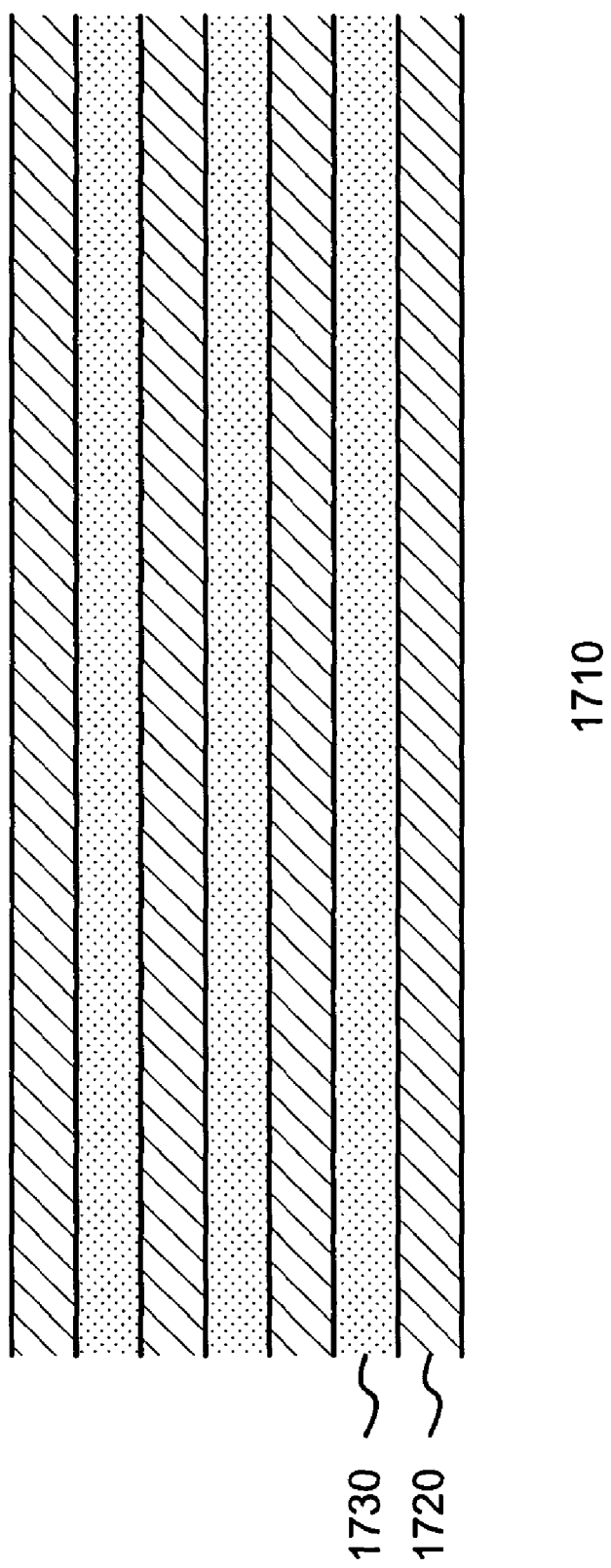

FIGS. 17 and 18 illustrate an exemplary process for forming a fin structure in a FinFET device in an alternate implementation consistent with the principles of the invention. With reference to FIG. 17, processing may begin with an insulating layer 1710 formed on a substrate (not shown). Insulating layer 1710 may comprise an oxide or another dielectric material. Layers of silicon 1720 and silicon-germanium 1730 may alternately be deposited on insulating layer 1710. In one implementation, each silicon layer 1720 may be deposited to a thickness ranging from about 10 Å to about 50 Å. Each silicon-germanium layer 1730 may be deposited to a thickness ranging from about 10 Å to about 50 Å. While four silicon layers 1720 and three silicon-germanium layers 1730 are illustrated in FIG. 17, other configurations are possible.

A fin structure 1810 may then be formed via etching, as illustrated in FIG. 18. The resulting layered fin structure 1810 improves mobility and drive current in the FinFET device due to the quantization effect.

CONCLUSION

Implementations consistent with the principles of the invention provide FinFET devices with a silicon layer formed on the upper surface of the fin structure in the channel region of the FinFET. The silicon layer may be doped to provide a low contact resistance. The silicon layer also provides an optional biasing opportunity, thereby enhancing FinFET performance.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A semiconductor device, comprising:
   a fin structure;
   a source region formed at one end of the fin structure;
   a drain region formed at an opposite end of the fin structure;
   a first gate formed on a first side of the fin structure;
   a second gate formed on a second side of the fin structure;
   a dielectric layer formed over a portion of the first and second gates; and
   a doped silicon structure formed on an upper surface of the fin structure, the doped silicon structure acting as a third gate and having a width that exceeds a width of the fin structure, the width of the doped silicon structure ranging from about 50 Å to about 5000 Å, the doped silicon structure being formed in an opening of the dielectric layer,
   wherein the first gate, the second gate, and the third gate are electrically separated.

2. The semiconductor device of claim 1 wherein the width of the fin structure ranges from about 200 Å to about 500 Å.

3. The semiconductor device of claim 2 wherein a height of the fin structure ranges from about 200 Å to about 1000 Å.

4. The semiconductor device of claim 1 wherein the first gate and the second gate comprise polysilicon.

5. The semiconductor device of claim 1 wherein the doped silicon structure includes a doped selective epitaxially grown silicon material.

6. A semiconductor device comprising:
   a fin structure;
   a source region formed at one end of the fin structure;

a drain region formed at an opposite end of the fin structure;

a first gate formed on a first side of the fin structure;

a second gate formed on a second side of the fin structure;

a doped silicon structure formed on an upper surface of the fin structure, the doped silicon structure having a width that exceeds a width of the fin structure, the width of the doped silicon structure ranging from about 50 Å to about 5000 Å; and a dielectric layer formed over a portion of the first and second gates, wherein the doped silicon structure is formed in an opening in the dielectric layer.

7. The semiconductor device of claim 1 wherein the doped silicon structure is formed above a channel region of the fin structure.

8. The semiconductor device of claim 1 wherein a thickness of the doped silicon structure ranges from about 500 Å to about 5000 Å.

9. A semiconductor device comprising:

a fin structure;

a first gate formed on a first side of the fin structure;

a second gate formed on a second side of the fin structure;

a dielectric layer formed over a portion of the first and second gates; and a doped silicon structure formed on an upper surface of the fin structure, the doped silicon structure acting as a third gate and having a width that exceeds a width of the fin structure, the width of the doped silicon structure ranging from about 50 Å to about 5000 Å, the doped silicon structure being formed in an opening of the dielectric layer, where the first gate, the second gate, and the third gate are electrically separated.

10. The semiconductor device of claim 9 wherein a thickness of the doped silicon structure ranges from about 500 Å to about 5000 Å.

11. The semiconductor device of claim 9 further comprising:

a source region formed at one end of the fin structure; and a drain region formed at an opposite end of the fin structure.

12. The semiconductor device of claim 9 wherein the width of the fin structure ranges from about 200 Å to about 500 Å.

13. The semiconductor device of claim 12 wherein a height of the fin structure ranges from about 200 Å to about 1000 Å.

* * * * *